United States Patent
Yamana

(10) Patent No.: US 9,532,470 B2
(45) Date of Patent: Dec. 27, 2016

(54) RESIN CASING

(71) Applicant: KEIHIN CORPORATION, Tokyo (JP)

(72) Inventor: Hirokazu Yamana, Utsunomiya (JP)

(73) Assignee: KEIHIN CORPORATION, Tokyo (JP)

( * ) Notice: Subject to any disclaimer, the term of this patent is extended or adjusted under 35 U.S.C. 154(b) by 0 days.

(21) Appl. No.: 14/223,170

(22) Filed: Mar. 24, 2014

(65) Prior Publication Data

US 2014/0291340 A1 Oct. 2, 2014

(30) Foreign Application Priority Data

Mar. 28, 2013 (JP) ................................. 2013-070449

(51) Int. Cl.
*B65D 43/02* (2006.01)
*H05K 5/00* (2006.01)
*H01L 21/673* (2006.01)

(52) U.S. Cl.
CPC ....... *H05K 5/0047* (2013.01); *H01L 21/67333* (2013.01); *B65D 43/0212* (2013.01)

(58) Field of Classification Search
CPC ..... B65D 43/0212; B65D 71/70; B65D 71/72; B65D 7/08; B65D 81/3294; H05K 5/0047; H01L 21/67333; H01R 43/205
See application file for complete search history.

(56) References Cited

U.S. PATENT DOCUMENTS

| | | | | | |
|---|---|---|---|---|---|
| 3,887,123 | A | * | 6/1975 | Hattingh | 206/521.1 |
| 5,418,692 | A | * | 5/1995 | Nemoto | 361/809 |
| 5,474,178 | A | * | 12/1995 | DiViesti | H01R 43/00 |
| | | | | | 206/564 |
| 5,664,851 | A | * | 9/1997 | Dunn | 312/102 |
| 5,772,038 | A | * | 6/1998 | Murata et al. | 206/725 |
| 2006/0237341 | A1 | * | 10/2006 | McDade | 206/509 |
| 2008/0121559 | A1 | * | 5/2008 | Friedrich et al. | 206/701 |
| 2011/0089079 | A1 | * | 4/2011 | Lo | H01L 21/67333 |
| | | | | | 206/711 |

FOREIGN PATENT DOCUMENTS

| | | |
|---|---|---|
| JP | 2004023868 A | 1/2004 |
| JP | 2004173465 A | 6/2004 |
| JP | 2012125963 A | 7/2012 |

OTHER PUBLICATIONS

Japanese Notice of Reasons for Rejection corresponding to Application No. 2013-070449; Mailing Date: Oct. 25, 2016, with English translation.

* cited by examiner

*Primary Examiner* — Andrew Perreault
(74) *Attorney, Agent, or Firm* — Cantor Colburn LLP

(57) ABSTRACT

A resin casing includes a resin case and a resin cover attached to the resin case. A plurality of depressions is formed respectively on an outer surface and an inner surface of a top plate of the resin cover. The depressions are alternately arranged on the outer surface and the inner surface along a predetermined direction as seen in a plan view.

4 Claims, 4 Drawing Sheets

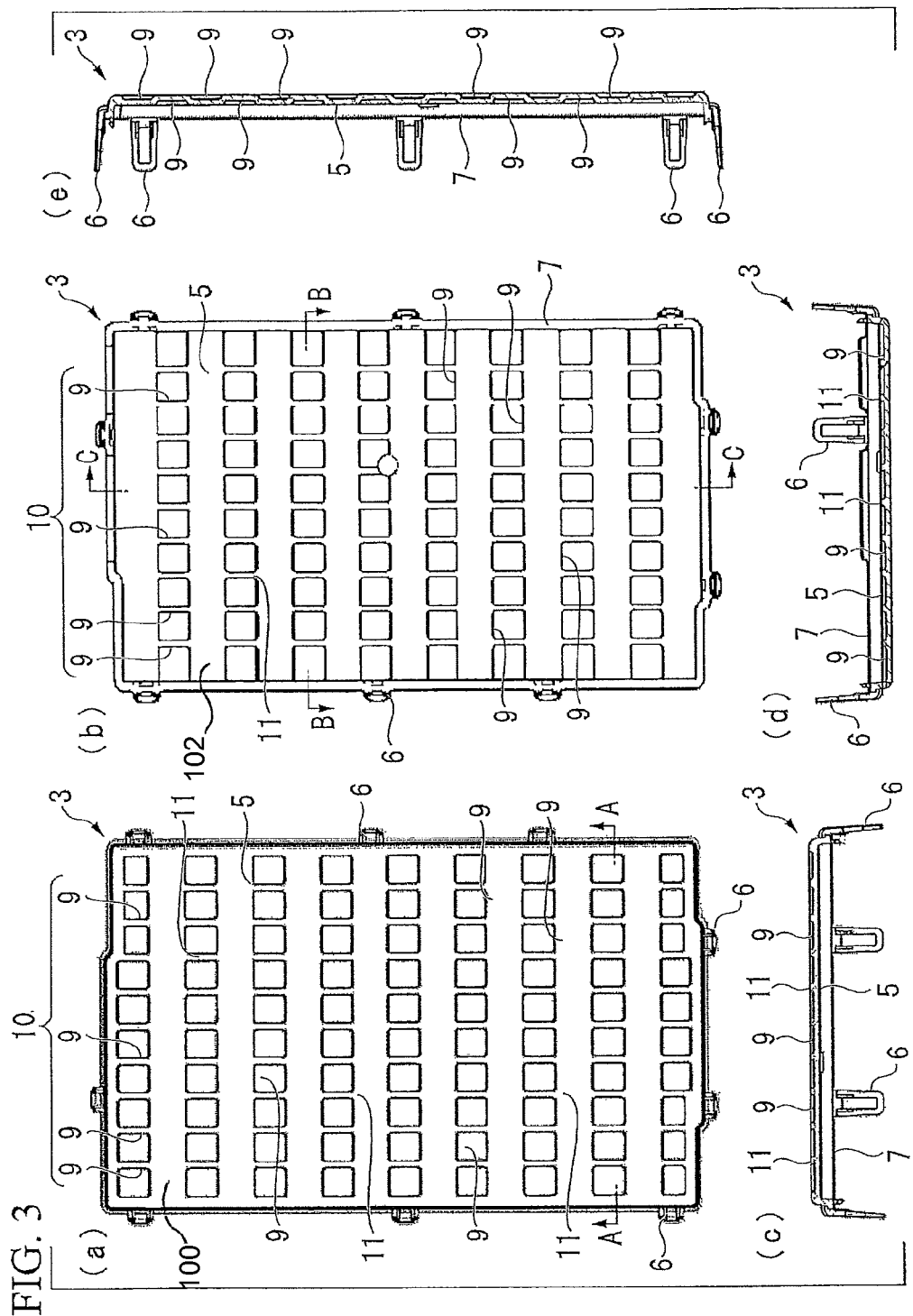

RESIN CASING

CROSS-REFERENCE TO RELATED APPLICATION

Priority is claimed on Japanese Patent Application No. 2013-070449, filed Mar. 28, 2013, the content of which is incorporated herein by reference.

BACKGROUND

Field of the Invention

The present invention relates to a resin casing.

Description of the Related Art

In various types of electronic equipment, electronic parts, an electronic circuit, and an electronic device constituting the electronic equipment are incorporated in a printed circuit board, and housed in a resin casing including a resin case and a resin cover. For example, when an electronic control unit as the electronic equipment is to be housed in a resin casing, if a board area of the electronic control unit increases, an area of a top plate of the resin cover also increases. Accordingly, the strength of the resin cover needs to be increased for the increased area of the resin cover.

Under such a background there has conventionally been known a resin casing having a structure such that grid-like ribs, in which the arrangement density of a central part and opposite ends along a long-side direction and a short-side direction of the resin cover is set higher than that of other parts, are integrally provided in a protruding condition on a rear surface of the resin cover (for example, refer to Japanese Unexamined Patent Application, First Publication No. 2004-173465).

SUMMARY

However, in the structure described in Japanese Unexamined Patent Application, First Publication No. 2004-173465, because the ribs are provided only on the rear surface (inner surface) of the resin cover, the strength thereof largely differs between two faces of the resin cover, that is, between an outer surface and the inner surface. Therefore, when the resin is cured at the time of molding, the opposite ends of the resin cover (the short sides of a rectangle) are likely to warp outward.

Moreover, because the grid-like ribs are provided on the rear surface of the resin cover, a ribbed portion and a crossover portion of the ribs become thick, and hence, there are large variations in the thickness of the cover. When there are large variations in the thickness, flowability of the resin deteriorates at the time of molding by a mold, and deformations such as warps and depressions are likely to occur at the time of curing the resin. Particularly, when the resin cover is molded by using resin added with glass fiber for increasing the strength of the resin cover, deformations such as warps and depressions are likely to occur more easily, because the flowability of the glass fiber becomes impaired due to the variations in the thickness.

In view of the above situation, it is an object of the present invention to provide a resin casing that prevents deformations such as warps by increasing resin moldability, while ensuring stiffness of the resin casing.

(1) A first aspect of the present invention is a resin casing including a resin case and a resin cover attached to the resin case, wherein a plurality of depressions is formed respectively on an outer surface and an inner surface of any of or both of a top plate of the resin cover and a bottom plate of the resin case, and the depressions are alternately arranged with respect to the outer surface and the inner surface, on the outer surface and the inner surface along a predetermined direction as seen in a plan view.

(2) In the aspect of (1) above, the depressions may be arranged linearly along a side direction of the top plate of the resin cover or along a side direction of the bottom plate of the resin case.

(3) In the aspect of (1) or (2) above, the top plate of the resin cover and the bottom plate of the resin case may have substantially a rectangular shape as seen in a plan view, and in any of or both of the top plate of the resin cover and the bottom plate of the resin case there may be formed a rib-shaped portion along a long-side direction of the top plate or the bottom plate, between the depressions adjacent to each other along a short-side direction of the top plate or the bottom plate on the same plane.

According to the resin casing of the aspect according to the present invention, a plurality of depressions is formed respectively on the outer surface and the inner surface of any of or both of the top plate of the resin cover and the bottom plate of the resin case, and the depressions are alternately arranged with respect to the outer surface and the inner surface, on the outer surface and the inner surface along a predetermined direction as seen in a plan view. As a result, the depressions are formed and arranged in a state of being dispersed substantially evenly on the outer surface and the inner surface. Accordingly, the strength becomes substantially the same between the outer surface and the inner surface, while increasing the strength of the top plate of the resin cover or the bottom plate of the resin case. Hence, the occurrence of warps due to a strength difference between the outer surface side and the inner surface side can be prevented when the resin is cured at the time of molding, while ensuring the stiffness of the resin casing.

Moreover, because the depression are alternately arranged on the outer surface and the inner surface, the depressions are formed and arranged in the state of being dispersed substantially evenly on the outer surface and the inner surface. Hence, variations in the thickness of the top plate of the resin cover or the bottom plate of the resin case can be reduced. As a result, the flowability of the resin can be improved at the time of molding by a mold, and the occurrence of deformations such as warps and depressions at the time of curing the resin can be prevented.

BRIEF DESCRIPTION OF THE DRAWINGS

FIG. 3 is a diagram showing the resin cover shown in FIG. 1. FIG. 3(a) is a plan view showing the surface (outer surface) side of the resin cover. FIG. 3(b) is a plan view showing the rear surface (inner surface) side of the resin cover. FIG. 3(c) is a sectional view on arrow A-A in FIG. 3(a). FIG. 3(d) is a sectional view on arrow B-B in FIG. 3(b). FIG. 3(e) is a sectional view on arrow C-C in FIG. 3(b).

DESCRIPTION OF THE EMBODIMENTS

Figure 1:
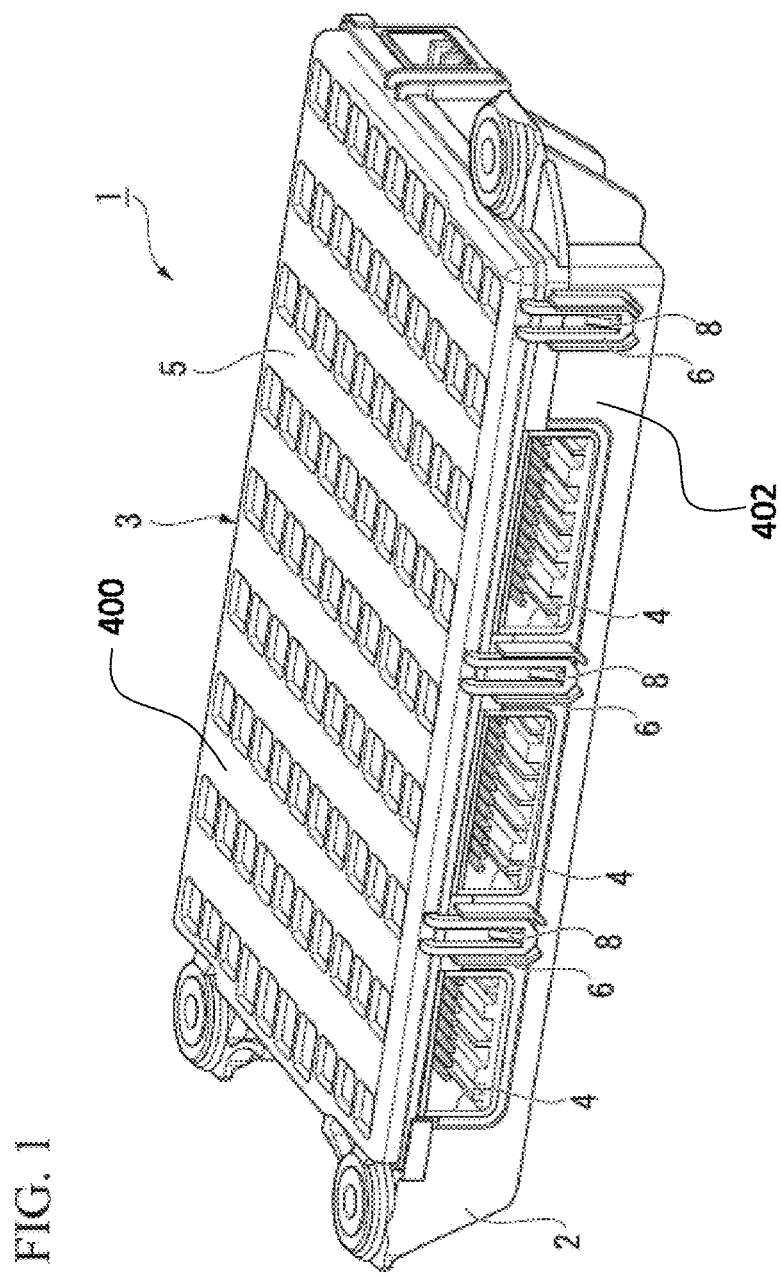
FIG. 1 is a perspective view showing a schematic configuration of a resin casing according to a first embodiment of the present invention.

Hereunder, a resin casing according to the present invention will be described in detail with reference to the drawings. In the drawings, the scale size of respective members is appropriately changed so that the respective members become recognizable.

FIG. 1 is a perspective view showing a schematic configuration of the resin casing according to a first embodiment of the present invention. Reference symbol 1 in FIG. 1 denotes a resin casing for an ECU (Electronic Control Unit) for a vehicle, that is, a resin casing for housing the electronic control unit.

The resin casing 1 includes a case made of resin (resin case) 2 that houses and holds a circuit board (not shown), and a cover made of resin (resin cover) 3 attached to the case 2.

The case 2 has a box shape having a substantially rectangular (substantially oblong) bottom plate (not shown) as seen in a plan view. In other words, the case comprises a plurality of faces such as first face 400 and second face 402. A resin composition in which glass fiber is added to a resin such as PBT (polybutylene terephthalate) as a reinforcing material, is used for the case 2, and the case 2 is molded by a mold. The case 2 has a recess (not shown) for housing and holding a circuit board inside of the central part thereof, and the circuit board is held in the recess. Moreover, a plurality of connector openings 4 with an opening of a connector facing outward, is formed on a side plate of the case 2.

Figure 2A:
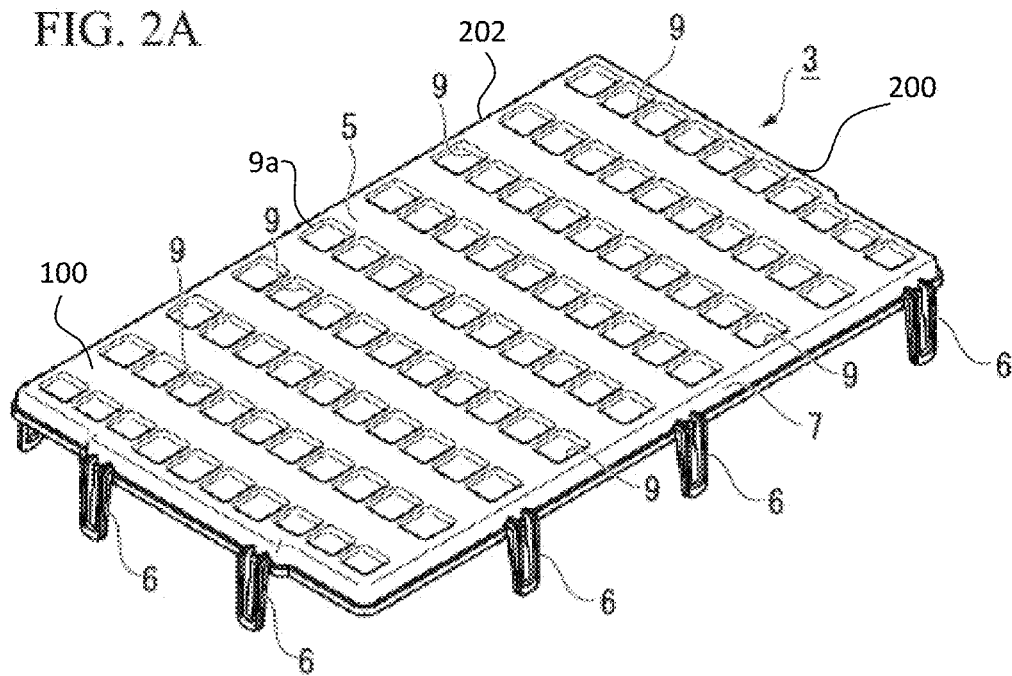
FIG. 2A is a perspective view showing a surface (outer surface) side of a resin cover shown in FIG. 1.
Figure 2B:
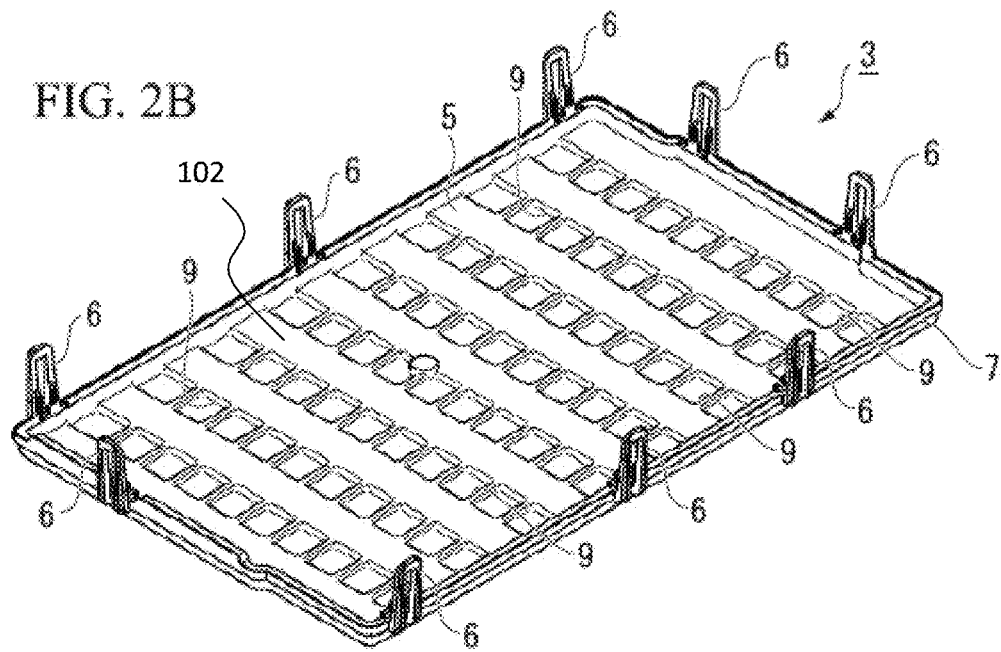
FIG. 2B is a perspective view showing a rear surface (inner surface) side of the resin cover shown in FIG. 1.

The cover 3 has a substantially rectangular top plate 5 corresponding to the shape of the case 2 as seen in a plan view, and is formed to block the opening of the case 2. That is to say, as shown in FIG. 2A, which is a perspective view showing a surface (outer surface 100) side of the cover, and in FIG. 2B, which is a perspective view showing a rear surface (inner surface 102) side of the cover, the cover 3 has a plurality of fitting pieces 6 (9 fitting pieces in the present embodiment) around the top plate 5. As shown in FIG. 2B, these fitting pieces 6 are integrally formed on a side wall 7 provided on a peripheral edge of the top plate 5, and are formed so as to be fitted to a fitting protrusion 8 formed on the side wall of the case 2 shown in FIG. 1. As a result, the cover 3 is held and fixed to the case 2 in a state with the opening of the case 2 blocked. In other words, the cover 3 and the case 2 together form a substantially rectangular prism shaped box.

As shown in FIGS. 2A and 2B, in the top plate 5, depressions 9 having edges 9a are formed on both sides of the surface (outer surface) and the rear surface (inner surface) thereof.

As shown in FIG. 3(a), which is a plan view showing the surface (outer surface) side of the cover 3, and in FIG. 3(b), which is a plan view showing the rear surface (inner surface) side thereof, an opening of the depression 9 is formed in a rectangular shape, that is, in a rectangular shape close to a square. On the respective surfaces, a plurality of such depressions 9 is linearly arranged in depression lines 10 with a predetermined gap along a length direction of the short side, i.e., a first edge 200, (short-side direction) of the top plate 5. Furthermore, the depression lines 10 arranged in this manner are arranged in a plurality of numbers along a length direction of the long side, i.e., a second edge 202, of the top plate 5.

Moreover, the respective depression lines 10 arranged in the length direction of the long side of the top plate 5 are arranged alternately on the surface and on the rear surface of the top plate 5 along the length direction of the long side (predetermined direction) as seen in a plan view, between the surface and the rear surface of the top plate 5. That is to say, as shown in FIG. 3(e), which is a sectional view on arrow C-C in FIG. 3(b), the depressions 9 on the surface (depression lines 10) and the depressions 9 on the rear surface (depression lines 10) are formed and arranged without overlapping on each other as seen in a plan view. As a result, as shown in FIG. 3(c), which is a sectional view on arrow A-A in FIG. 3(a), and as shown in FIG. 3(d), which is a sectional view on arrow B-B in FIG. 3(b), the rear side of the respective depressions 9 are flat portions on the respective surfaces.

Because the depressions 9 having substantially the same shape are regularly arranged alternately on the surface and on the rear surface of the top plate 5, then as shown in FIGS. 3(a) and 3(b), the depressions 9 are formed and arranged on the top plate 5 in a state of being dispersed substantially evenly on the surface and the rear surface. Moreover, the plurality of depressions 9 are linearly arranged with a predetermined gap along the length direction of the short side (short-side direction) of the top plate 5 as described above. As a result, a linear (segment-like) rib-shaped portion 11 along the long-side direction of the top plate 5 is formed between the depressions 9 adjacent to each other in the short-side direction.

As shown in FIGS. 3(c) and 3(d), the rib-shaped portion 11 is formed with a height corresponding to the depth of the depression 9. Because the depressions 9 are arranged alternately between the surface and the rear surface of the top plate 5, the rib-shaped portions 11 are arranged alternately on the surface and on the rear surface along the length direction of the long side (predetermined direction) of the top plate 5 as seen in a plan view.

For the cover 3 having such a configuration, a resin composition in which glass fiber is added to a resin such as PBT (polybutylene terephthalate) as a reinforcing material, is used in the present embodiment, and the cover 3 is molded by a mold.

In the resin casing 1 according to the present embodiment, a plurality of depressions 9 is formed on the surface and the rear surface of the top plate 5 of the cover 3, and is arranged with respect to the surface and the rear surface alternately on the surface and on the rear surface along the long-side direction as seen in a plan view. As a result, the depressions 9 are formed and arranged in the state of being dispersed substantially evenly on the surface and the rear surface. Accordingly, the entire top plate 5 of the cover 3 has a substantially uniform thickness, and the strength becomes substantially the same on the surface side and the rear surface side, while increasing the strength of the cover 3. Hence, the occurrence of warps due to a strength difference between the surface side and the rear surface side can be prevented when the resin is cured at the time of molding, while ensuring the stiffness of the resin casing 1.

Moreover, because the depressions 9a are alternately arranged on the surface and on the rear surface, the depressions 9a are formed and arranged in the state of being dispersed substantially evenly on the surface and the rear surface. Hence, variations in the thickness of the top plate 5A of the cover 3 can be reduced. As a result, the flowability of the resin is improved at the time of molding by a mold, and the occurrence of deformations such as warps and depressions at the time of curing the resin can be prevented.

Particularly in the present embodiment, in order to increase the strength of the cover 3, the cover 3 is formed by molding by a mold by using a resin composition added with glass fiber as a reinforcing material. Therefore, the flowability of the resin at the time of molding decreases due to the addition of glass fiber. However, as described above, the flowability of the resin at the time of molding by a mold is improved, and the occurrence of deformations such as warps and depressions at the time of curing the resin can be prevented reliably by reducing the variations in the thickness of the top plate 5 of the cover 3.

Furthermore, because the depressions 9 are arranged linearly along the short-side direction of the top plate 5 of the cover 3, the shape of the depression 9 can be simplified, thereby enabling to improve the flowability of the resin at the time of molding, and improve the resin moldability.

Moreover, because the linear (segment-like) rib-shaped portion 11 along the long-side direction of the top plate 5 is formed between the depressions 9 adjacent to each other in the short-side direction, stiffness of the top plate 5 can be increased, and particularly, a deformation such that the opposite ends in the long-side direction (short side of a rectangle) of the oblong top plate 5 warp outward or inward can be prevented.

Furthermore, because the rib-shaped portion 11 is provided only in the long-side direction in which the stiffness of the oblong top plate 5 becomes relatively low, the number of ribs can be decreased as compared with a conventional case in which the ribs are formed in a grid, and the crossover portion of the ribs can be eliminated, thereby enabling to further improve the flowability of the resin at the time of molding and the resin moldability.

In the first embodiment, a case in which the depressions 9 are formed in the top plate 5 of the cover 3 has been described. However, the present invention is not limited thereto, and the depressions 9 as shown in FIGS. 2A and 2B, and FIGS. 3(a) to 3(e) may be formed in the bottom plate of the case 2. Moreover, the depressions 9 may be formed in both the top plate 5 of the cover 3 and the bottom plate of the case 2.

Figure 4A:
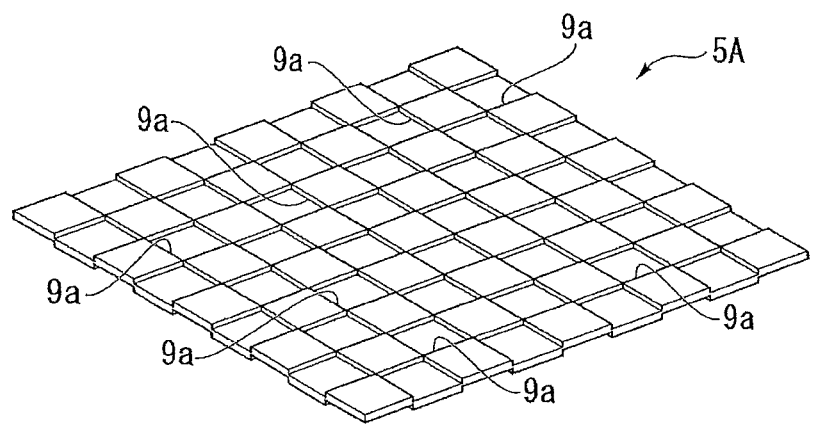
FIG. 4A is a perspective view of a top plate of a resin cover of a resin casing according to a second embodiment of the present invention.

FIG. 4A is a perspective view of a top plate of a resin cover of a resin casing according to a second embodiment of the present invention. Reference symbol 5A in FIG. 4A denotes a top plate of a cover (resin cover). The top plate 5A is formed in a square shape. Although not shown, fitting pieces 6 as shown in FIGS. 2A and 2B are formed on the cover having the top plate 5A. Moreover, a case (resin case) attached with the cover has a bottom plate formed in a square shape corresponding to the cover.

In the top plate 5A, a plurality of depressions 9a is formed in a square shape, and these depressions 9a are arranged with respect to a surface (outer surface) and a rear surface (inner surface) alternately on the surface and on the rear surface along a predetermined direction as seen in a plan view.

That is to say, the depressions 9a are arranged in a staggered arrangement respectively on the surface and the rear surface. Accordingly, in any direction of a longitudinal direction and a horizontal direction in the top plate 5A, the depressions 9a are arranged alternately on the surface and on the rear surface as seen in a plan view.

Even in the resin casing including the cover having the top plate 5A having such a configuration, the depressions 9a are alternately arranged on the surface and the rear surface of the top plate 5A. As a result the depressions 9a are formed and arranged in a state of being dispersed substantially evenly on the surface and the rear surface. Accordingly, the entire top plate 5A has a substantially uniform thickness, and the strength becomes substantially the same on the surface side and the rear surface side, while increasing the strength of the cover. Hence, the occurrence of warps due to a strength difference between the surface side and the rear surface side can be prevented when the resin is cured at the time of molding, while ensuring the stiffness of the resin casing.

Moreover, because the depressions 9a are alternately arranged on the surface and on the rear surface, thereby forming and arranging the depressions 9a in the state of being dispersed substantially evenly on the surface and the rear surface, variations in the thickness of the top plate 5A of the cover can be reduced. As a result, the flowability of the resin at the time of molding by a mold is improved, and the occurrence of deformations such as warps and depressions at the time of curing the resin can be prevented. Particularly in the present embodiment, the depressions 9a are not arranged adjacent to each other via the rib-shaped portions on the same plane, and hence, the rib-shaped portions are not formed both on the surface and on the rear surface. Therefore, variations in the thickness of the top plate 5A of the cover can be eliminated substantially, and as a result, the flowability of the resin at the time of molding can be further improved.

Figure 4B:
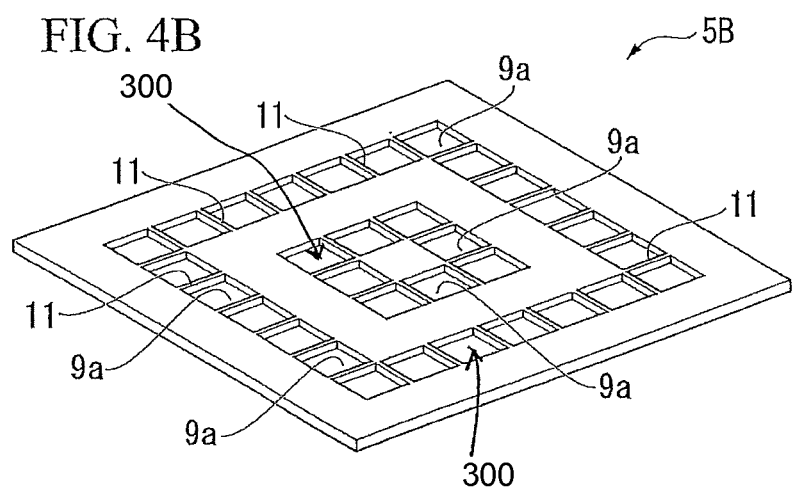
FIG. 4B is a perspective view of a top plate of a resin cover of a resin casing according to a third embodiment of the present invention.

FIG. 4B is a perspective view of a top plate of a resin cover of a resin casing according to a third embodiment of the present invention. In FIG. 4B, reference symbol 5B denotes a top plate of a cover (resin cover). The top plate 5B is also formed in a square shape. Although not shown, fitting pieces 6 as shown in FIGS. 2A and 2B are also formed on the cover having the top plate 5B. Moreover, a case (resin case) attached with the cover has a bottom plate formed in a square shape corresponding to the cover.

In the top plate 5B, a plurality of depressions 9a is formed in a square shape, and these depressions 9a are arranged with respect to a surface (outer surface) and a rear surface (inner surface) alternately on the surface and on the rear surface along a predetermined direction as seen in a plan view. In other words, the depressions 9a on the outer surface are arranged in a plurality of concentric squares 300.

That is to say, the depressions 9a are formed in a wavelike formation respectively on the surface and on the rear surface, and are alternately arranged on the surface and on the rear surface as seen in a plan view, as going in four directions from the center toward respective sides.

According to the present embodiment, a set of depressions including one or a plurality of depressions 9a is arranged alternately on the surface and on the rear surface as seen in a plan view, excluding an outer peripheral portion at a position deviated from the center in the longitudinal direction or in the horizontal direction. Accordingly, by regarding the set formed of the plurality of depressions 9a as one depression, in the present embodiment, the depressions are arranged with respect to the surface (outer surface) and the rear surface (inner surface) alternately on the surface and on the rear surface along a predetermined direction as seen in a plan view. Particularly, in the set formed of the plurality of depressions 9a, the linear (segment-like) rib-shaped portion 11 along the side direction of the top plate 5B, that is, along the side in the longitudinal direction or the side in the horizontal direction is formed between the depressions 9a adjacent to each other on the same plane.

Even in the resin casing including the cover having the top plate 5B having such a configuration, the depressions are arranged alternately on the surface and on the rear surface of the top plate 5B along the predetermined direction as seen in a plan view of the depressions 9a. As a result the depressions 9a are formed and arranged in the state of being dispersed substantially evenly on the surface and the rear surface. Accordingly, the entire top plate 5B has a substantially uniform thickness, and the strength becomes substantially the same on the surface side and the rear surface side, while increasing the strength of the cover. Hence, the occurrence of warps due to a strength difference between the surface side and the rear surface side can be prevented when the resin is cured at the time of molding, while ensuring the stiffness of the resin casing.

Moreover, because the depressions 9a are alternately arranged on the surface and on the rear surface, thereby forming and arranging the depressions 9a in the state of being dispersed substantially evenly on the surface and the rear surface, variations in the thickness of the top plate 5B of the cover can be reduced. As a result, the flowability of the resin at the time of molding by a mold is improved, and the occurrence of deformations such as warps and depressions at the time of curing the resin can be prevented.

Furthermore, because the rib-shaped portion 11 is formed between the depressions 9a adjacent to each other in the side direction, the stiffness of the top plate 5B can be increased, thereby enabling to prevent deformations such as warps.

In the second and third embodiments, a case in which the depressions 9a are formed in the top plate 5A (5B) of the cover has been described. However, the present invention is not limited thereto, and the depressions 9a in the form shown in FIGS. 4A and 4B may be formed in a square bottom plate of the case 2. Moreover, the depressions 9a may be formed in both the top plate 5A (5B) of the cover and the bottom plate of the case 2.

Furthermore, in the embodiments described above, a case in which the resin casing of the present invention is applied to a resin casing for housing an electronic control unit has been described. However, the present invention is not limited thereto, and the resin casing of the present invention can be applied to a resin casing for housing various units.

What is claimed is:

1. A resin casing that houses an electronic control unit, the resin casing comprising:
   a plurality of faces formed of resin and defining a substantially rectangular prism shape;
   wherein a first face of the plurality of faces comprises an outer surface and an inner surface;
   a plurality of outer depressions are provided in the outer surface of the first face;
   a plurality of inner depressions are provided in the inner surface of the first face;
   the first face is substantially rectangular shaped and comprises a first edge and a second edge substantially perpendicular to the first edge;
   none of the plurality of outer depressions overlaps with any one of the plurality of inner depressions when viewed in a direction perpendicular to the outer surface and the inner surface;
   the inner and outer depressions each comprise an opening and all of the openings are formed in a substantially same shape and size.

2. The resin casing of claim 1,
   wherein the plurality of outer depressions are arranged in a plurality of outer depression rows substantially parallel to the first edge, wherein a distance between adjacent depressions in a row of the plurality of outer depression rows is smaller than a length of a edge of one of the depressions;
   the plurality of inner depressions are arranged in a plurality of inner depression rows parallel to the first edge, wherein a distance between adjacent depressions in a row of the plurality of inner depression rows is smaller than a length of a edge of one of the depressions; and
   wherein the plurality of outer depression rows and the plurality of inner depression rows are arranged such that the plurality of outer depression rows and the plurality of inner depression rows alternate in a direction parallel to the second edge.

3. The resin casing of claim 1,
   wherein all of the depressions are depressed in a substantially same depth.

4. The resin casing of claim 1,
   wherein none of the depressions houses the electronic control unit.

* * * * *